(12) United States Patent
Sumi et al.

(10) Patent No.: US 10,297,742 B2
(45) Date of Patent: May 21, 2019

(54) PIEZOELECTRIC ELEMENT AND DEVICE INCLUDING THE SAME

(71) Applicant: Seiko Epson Corporation, Tokyo (JP)

(72) Inventors: Koji Sumi, Shiojiri (JP); Tomohiro Sakai, Matsumoto (JP); Tetsuya Isshiki, Shiojiri (JP); Toshiaki Takahashi, Chino (JP); Kazuya Kitada, Suwa (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 15/804,191

(22) Filed: Nov. 6, 2017

(65) Prior Publication Data

US 2018/0138393 A1 May 17, 2018

(30) Foreign Application Priority Data

Nov. 16, 2016 (JP) .................. 2016-223532

(51) Int. Cl.

| | |
|---|---|
| *H01L 41/08* | (2006.01) |
| *H01L 41/04* | (2006.01) |
| *H01L 41/047* | (2006.01) |
| *H01L 41/29* | (2013.01) |
| *B41J 2/14* | (2006.01) |
| *H01L 41/319* | (2013.01) |

(Continued)

(52) U.S. Cl.
CPC ...... *H01L 41/0815* (2013.01); *B41J 2/14201* (2013.01); *B41J 2/14233* (2013.01); *B41J 2/161* (2013.01); *B41J 2/1628* (2013.01); *B41J 2/1629* (2013.01); *B41J 2/1635* (2013.01); *B41J 2/1642* (2013.01); *B41J 2/1646* (2013.01); *H01L 41/0477* (2013.01); *H01L 41/1873* (2013.01); *H01L 41/29* (2013.01); *H01L 41/317* (2013.01); *H01L 41/318* (2013.01); *H01L 41/319* (2013.01); *H01L 41/332* (2013.01); *B41J 2002/14241* (2013.01); *B41J 2002/14419* (2013.01); *B41J 2202/03* (2013.01)

(58) Field of Classification Search
CPC ............. H01L 41/0477; H01L 41/1873; H01L 41/0815; B41J 2/14201; B41J 2/14233; B41J 2/161; B41J 2/1628; B41J 2/1629; B41J 2/1635; B41J 2/1646

See application file for complete search history.

(56) References Cited

U.S. PATENT DOCUMENTS

| | | | |
|---|---|---|---|
| 2003/0222947 A1 | 12/2003 | Tomozawa et al. | |
| 2007/0126313 A1* | 6/2007 | Ueno ................. | H03H 9/02031 310/311 |

(Continued)

FOREIGN PATENT DOCUMENTS

| | | |
|---|---|---|
| JP | 2004-235599 A | 8/2004 |
| JP | 2007-019302 A | 1/2007 |

(Continued)

*Primary Examiner* — J. San Martin
(74) *Attorney, Agent, or Firm* — Harness, Dickey & Pierce, P.L.C.

(57) ABSTRACT

A piezoelectric element includes a first and a second electrode, a piezoelectric layer between the first electrode and the second electrode, and an orientation control layer between the first electrode and the piezoelectric layer. The orientation control layer contains perovskite complex oxide containing potassium, sodium, calcium, and niobium and preferentially oriented in the (100) plane.

11 Claims, 10 Drawing Sheets

(51) Int. Cl.
  *H01L 41/332* (2013.01)
  *H01L 41/317* (2013.01)
  *B41J 2/16* (2006.01)
  *H01L 41/187* (2006.01)
  *H01L 41/318* (2013.01)

(56) References Cited

U.S. PATENT DOCUMENTS

| | | | |
|---|---|---|---|
| 2007/0271750 A1* | 11/2007 | Hamada | C23C 18/1216 29/25.01 |
| 2009/0189482 A1* | 7/2009 | Shibata | G01C 19/5663 310/311 |
| 2010/0141099 A1* | 6/2010 | Suenaga | H01L 41/047 310/365 |
| 2012/0120161 A1* | 5/2012 | Sakai | B41J 2/055 347/71 |
| 2013/0043767 A1* | 2/2013 | Yamamoto | H01L 41/094 310/330 |
| 2013/0127293 A1 | 5/2013 | Ikeuchi et al. | |
| 2013/0187990 A1 | 7/2013 | Sakai et al. | |
| 2013/0249354 A1* | 9/2013 | Watanabe | H01L 41/18 310/369 |
| 2013/0250006 A1 | 9/2013 | Sakai | |
| 2014/0210915 A1* | 7/2014 | Isshiki | B41J 2/14201 347/71 |
| 2015/0109372 A1 | 4/2015 | Aida et al. | |
| 2015/0231884 A1* | 8/2015 | Kobayashi | B41J 2/14201 347/70 |
| 2016/0218271 A1* | 7/2016 | Sakuma | G11B 5/483 |
| 2016/0276572 A1 | 9/2016 | Sumi et al. | |
| 2016/0284969 A1* | 9/2016 | Sumi | H01L 41/0815 |
| 2016/0365503 A1* | 12/2016 | Ikeuchi | C23C 14/08 |
| 2016/0372654 A1* | 12/2016 | Ikeuchi | C01G 33/006 |
| 2017/0062697 A1 | 3/2017 | Sakai et al. | |

FOREIGN PATENT DOCUMENTS

| | | | | |
|---|---|---|---|---|
| JP | 2013-146928 A | | 8/2013 | |
| JP | 2013-201407 A | | 10/2013 | |
| JP | 2014-042047 A | | 3/2014 | |
| JP | 2014042047 A | * | 3/2014 | ........... C23C 14/083 |
| JP | 2015-082658 A | | 4/2015 | |
| JP | 2016-178253 A | | 10/2016 | |
| JP | 2017-050352 A | | 3/2017 | |
| WO | WO-2012141105 A1 | * | 10/2012 | ........... C04B 35/495 |

* cited by examiner

PIEZOELECTRIC ELEMENT AND DEVICE INCLUDING THE SAME

This application claims priority under 35 U.S.C. § 119 to Japanese Patent Application No. 2016-223532 filed on Nov. 16, 2016, the entire disclosure of which is expressly incorporated by reference herein.

BACKGROUND

1. Technical Field

The present invention relates to a piezoelectric element and a device including the same.

2. Related Art

Piezoelectric elements typically include a piezoelectric layer capable of electromechanical conversion, and an upper and a lower electrode between which the piezoelectric element is disposed. In recent years, there have been actively developed devices (piezoelectric element-applied devices) including such a piezoelectric element. The piezoelectric element-applied devices that have been being developed include liquid ejecting heads typified by an ink jet recording head, MEMS (microelectromechanical system) elements typified by a piezoelectric MEMS element, ultrasonic measuring devices typified by an ultrasonic sensor, and piezoelectric actuator devices.

The piezoelectric material used in the piezoelectric layer is required to exhibit high piezoelectric performance. A binary complex oxide having a perovskite structure (perovskite complex oxide) containing lead titanate ($PbTiO_3$, referred to as PT) and lead zirconate ($PbZrO_3$, referred to as PZ), that is, lead zirconate titanate ($Pb(Zr,Ti)O_3$, referred to as PZT), is one of the well-known piezoelectric materials. On the other hand, lead-free piezoelectric materials, such as potassium sodium niobate ($(K,Na)NbO_3$, referred to as KNN), bismuth ferrate ($BiFeO_3$, referred to as BFO), have recently been developed from the viewpoint of eliminating the adverse environmental impact of lead.

To achieve high piezoelectric performance, crystals of a perovskite complex oxide must be preferentially oriented in the (100) plane. From this viewpoint, a variety of approaches are proposed as follows. For example, JP-A-2004-235599 discloses that calcium (Ca) is added to a noble metal electrode for orientation in the electrode. In JP-A-2013-201407, bismuth (Bi) or the like is added to a perovskite buffer layer (orientation control layer). In JP-A-2013-146928, Bi, cobalt (Co), and iron (Fe) are added to an oxide buffer layer. In JP-A-2015-82658, iridium (Ir) is cited as one of the materials that can be used in the lower electrode. JP-A-2007-19302 discloses that a potassium niobate ($KNbO_3$) buffer layer which may contain magnesium oxide (MgO) or any other additive may be disposed between the lower electrode and a KNN piezoelectric layer. JP-A-2014-42047 discloses that a piezoelectric thin-film buffer layer and a piezoelectric thin-film layer are each a perovskite layer containing potassium (K), sodium (Na), and niobium (Nb).

If a piezoelectric element is manufactured through the process step of forming a piezoelectric layer of any one of the above-mentioned piezoelectric materials, such as KNN, on a 6-inch or larger wafer as a substrate, the in-plane nuclear density distribution of crystals varies according to the process conditions, and, thus, a (100) plane-oriented uniform film is difficult to form. If an electrode of a piezoelectric element is made of Ir and a KNN piezoelectric layer is formed on the Ir electrode, the orientation of KNN crystals is disordered, and the piezoelectric performance of the piezoelectric element is reduced. While the techniques disclosed in the above-cited patent documents may be applied to solve these problems with crystal orientation in the KNN piezoelectric layer, there is room for improvement in controlling the orientation of KNN crystals.

SUMMARY

An advantage of some aspects of the invention is that it provides a piezoelectric element and a device including the same, the piezoelectric element including a piezoelectric layer that can be formed uniformly in an in-plane direction on a large-area substrate and preferentially oriented in the (100) plane, and that can keep the crystal orientation thereof independently of the state of the underlying layer to prevent the piezoelectric performance thereof from being reduced.

According to an aspect of the invention, there is provided a piezoelectric element including a first and a second electrode, a piezoelectric layer between the first electrode and the second electrode, and an orientation control layer between the first electrode and the piezoelectric layer. The orientation control layer contains perovskite complex oxide containing potassium, sodium, calcium, and niobium and preferentially oriented in the (100) plane.

The presence of the orientation control layer containing perovskite complex oxide preferentially oriented in the (100) plane and containing potassium, sodium, calcium, and niobium allows the piezoelectric layer to be formed uniformly in an in-plane direction on a large-area substrate and enables the piezoelectric layer to be preferentially oriented in the (100) plane and to keep the crystal orientation independently of the state of the underlying layer, thus preventing the piezoelectric performance from being reduced.

Preferably, the proportion of the calcium to the potassium in the orientation control layer is 0.1 at % to 30 at %. Such an orientation control layer allows the piezoelectric layer to be formed more uniformly in an in-plane direction on the substrate and enables the piezoelectric layer to be more preferentially oriented in the (100) plane.

Preferably, the proportion of the calcium to the total of the potassium and the sodium in the orientation control layer is 0.1 at % to 10 at %. Such an orientation control layer allows the piezoelectric layer to be formed more uniformly in an in-plane direction on the substrate and enables the piezoelectric layer to be more preferentially oriented in the (100) plane.

When the mole ratio of the potassium and the sodium in the orientation control layer is 1:1, the ratio of the total moles of potassium, sodium, and calcium to the total moles of potassium, sodium, calcium, and niobium may be 0.4:1 to 0.6:1. Such an orientation control layer allows the piezoelectric layer to be formed more uniformly in an in-plane direction on the substrate and enables the piezoelectric layer to be more preferentially oriented in the (100) plane.

Preferably, the first electrode may contain at least one selected from the group consisting of platinum, iridium, and iridium oxide. Such a first electrode helps to form the piezoelectric layer more uniformly in an in-plane direction on a large-area substrate and to orient preferentially the piezoelectric layer in the (100) plane.

According to another aspect of the invention, a device including the above-described piezoelectric element is provided.

In manufacture of this device, the piezoelectric layer can be formed uniformly in an in-plane direction on a large-area substrate and preferentially oriented in the (100) plane. The piezoelectric layer can keep the crystal orientation thereof independently of the underlaying layer, and accordingly, the piezoelectric performance of the device is not likely to be reduced.

BRIEF DESCRIPTION OF THE DRAWINGS

The invention will be described with reference to the accompanying drawings, wherein like numbers reference like elements.

DESCRIPTION OF EXEMPLARY EMBODIMENTS

Figure 1:
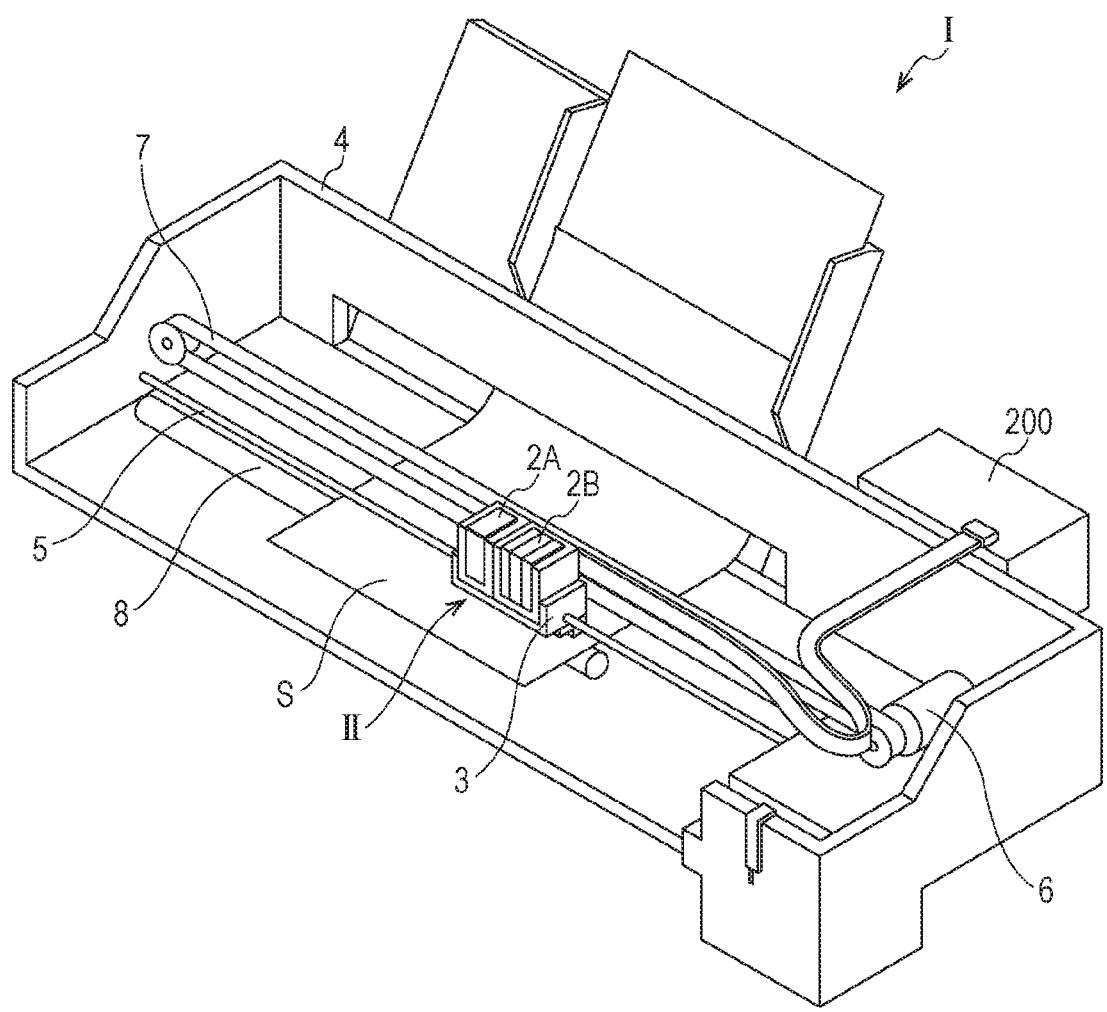
FIG. 1 is a schematic view of the general structure of an ink jet recording apparatus.

Exemplary embodiments of the invention will now be described with reference to the drawings. The following embodiments are disclosed by way of example, and various modifications may be made without departing from the spirit and scope of the invention. In the drawings, like reference numerals denote like elements, and thus description thereof is omitted. X, Y, and Z in the drawings denote three spatial axes perpendicular to each other. In the description herein, direction along these axes are each referred to as a first direction X (X direction), a second direction Y (Y direction), and a third direction Z (Z direction), and the direction indicated by each arrow in the drawings is defined as the positive (+) direction, and the direction opposite to that indicated by the arrow is defined as the negative (−) direction. The X and Y directions refer to the in-plane direction of plates, layers, or films, and the Z direction refers to the thickness direction of the plates, layers, or films, or the direction in which they lie one on top of another.

Some of the components shown in the drawings may be magnified in shape, dimension, thickness, relative position, repeating unit, and the like for convenience of description. Also, the expression "on something" used herein does not necessarily mean "directly on something". For example, the expression "the first electrode on the substrate" or "the piezoelectric layer on the first electrode" does not necessarily exclude a structure in which another layer is disposed between the substrate and the first electrode or between the first electrode and the piezoelectric layer.

First Embodiment

An ink jet recording apparatus, which is a type of liquid ejection apparatus, will now be described with reference to FIG. 1. FIG. 1 is a schematic view of the general structure of an ink jet recording apparatus. In the ink jet recording apparatus (recording apparatus I), cartridges 2A and 2B are removably attached to an ink jet recording head unit (head unit II). The cartridges 2A and 2B are each an ink feeder. The head unit II includes a plurality of ink jet recording heads (see recording head 1 in FIG. 2) as will be described later and is mounted to a carriage 3. The carriage 3 is secured to a carriage shaft 5 fixed to the apparatus body 4 and is movable along the shaft. The head unit II and the carriage 3 are each configured to eject a black ink composition and color ink compositions.

The carriage 3 to which the recording head unit II is mounted is moved along the carriage shaft 5 by transmitting a driving force from a driving motor 6 to the carriage 3 through a plurality of not-shown gears and a timing belt 7. In the apparatus body 4, a transport roller 8, or transport device, is disposed so as to transport a recording sheet S that may be a paper sheet or any other recording medium. The transport device for transporting the recording sheet S is not limited to the transport roller 8 and may be in the form of a belt or a drum.

The recording head 1 includes a piezoelectric element 300 (see FIG. 2) according to an embodiment of the invention, which will be described in detail later, as a piezoelectric actuator device. The use of the piezoelectric element 300 prevents the degradation in properties (durability, ink ejection performance, and so forth) of the recording apparatus I.

Figure 2:
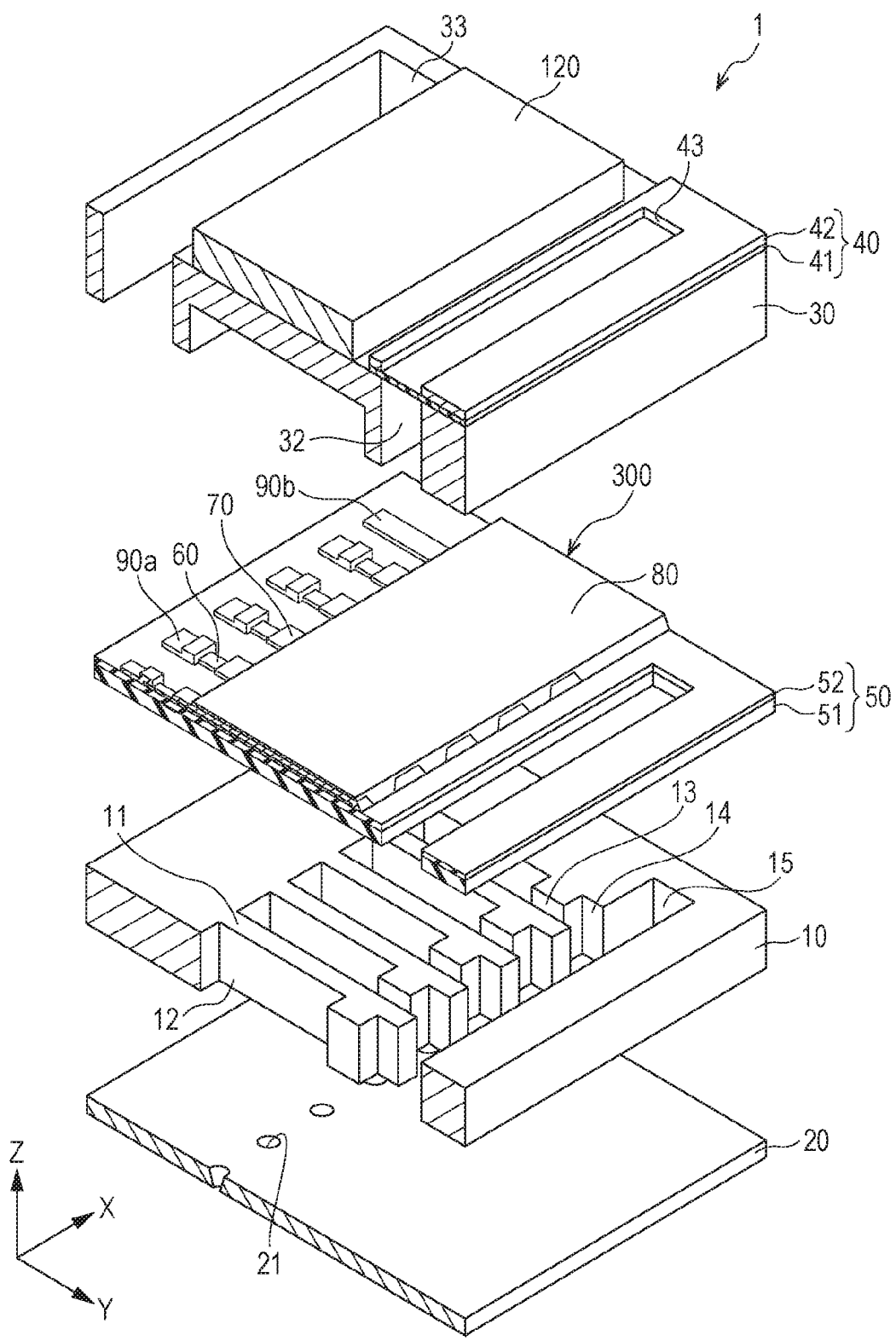
FIG. 2 is an exploded perspective view of the general structure of an ink jet recording head.
Figure 3:
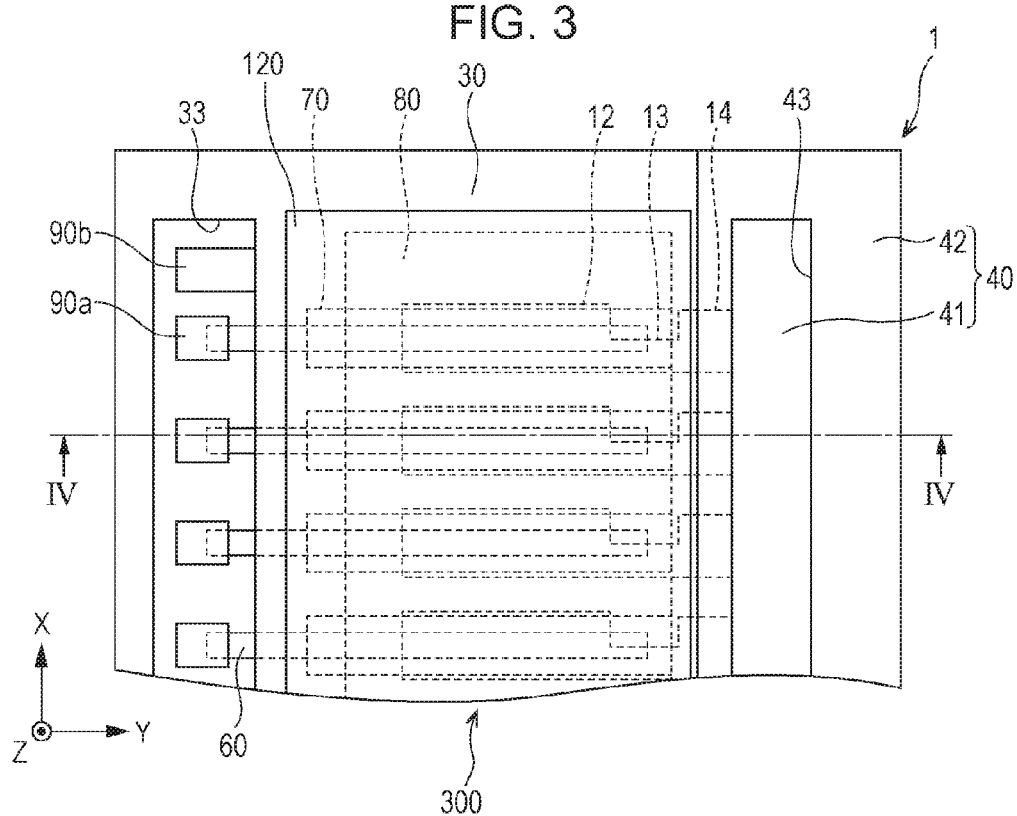
FIG. 3 is a plan view of the general structure of an ink jet recording head.
Figure 4:
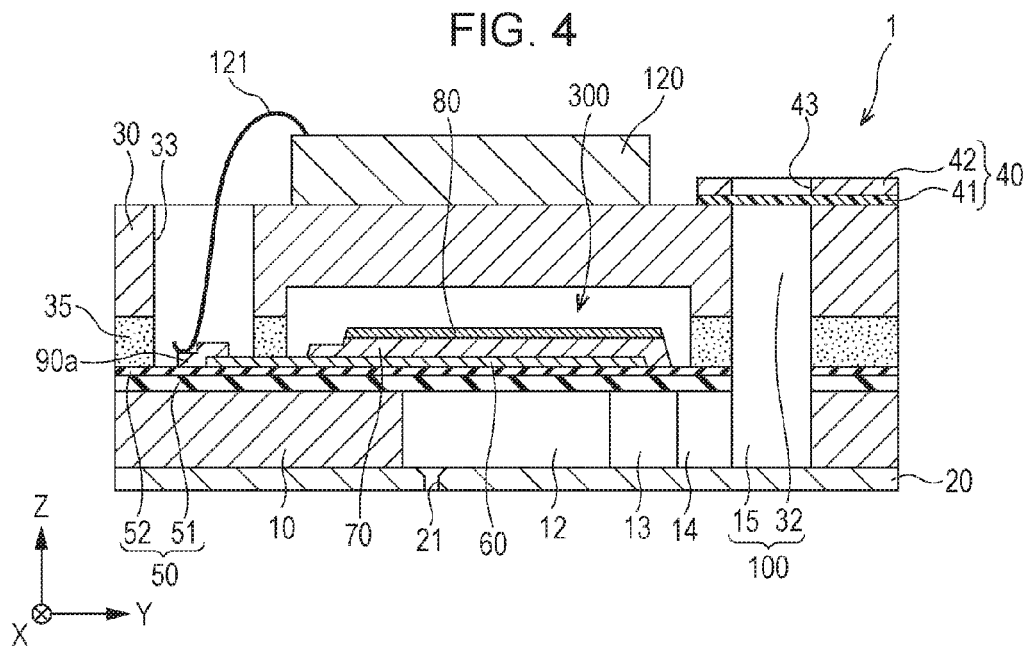
FIG. 4 is a sectional view of the general structure of an ink jet recording head.

An ink jet recording head, which is a type of liquid ejecting head incorporated into a liquid ejection apparatus, will now be described with reference to FIGS. 2 to 4. FIG. 2 is an exploded perspective view of an ink jet recording head. FIG. 3 is a plan view of a flow channel substrate viewed from above he piezoelectric element, and FIG. 4 is a sectional view taken along line IV-IV in FIG. 3.

As shown in these figures, the flow channel substrate (hereinafter often referred to as substrate 10) is, for example, a monocrystalline silicon substrate, and in which pressure generating chambers 12 are formed. The pressure generating chambers 12 are separated by a plurality of partition members 11 and are arranged along the arrangement of nozzle apertures 21 from which the same color ink is ejected (in the X direction). The material of the substrate 10 is not limited to silicon and may be SOI (silicon on insulator) or glass.

The substrate 10 has ink supply channels 13 and communication paths 14 therein at one end of each pressure generating chamber 12 extending in the Y direction. A communicating section 15 is formed on the outer side (+Y direction side) of the communication paths 14. The communicating section 15 defines a part of a manifold 100. The manifold 100 acts as a common ink chamber shared by the pressure generating chambers 12. Thus, the substrate 10 has therein liquid flow channels including the pressure generating chambers 12, the ink supply channels 13, the communication paths 14, and the communicating section 15.

A nozzle plate 20 made of, for example, SUS is joined to one of the opposing surfaces (the surface on the −Z direction) of the substrate 10. Nozzle apertures 21 are arranged in the X direction in the nozzle plate 20. The nozzle apertures 21 communicate with the respective pressure generating chambers 12. The nozzle plate 20 may be bonded to the substrate 10 with an adhesive, a thermal fusion film, or the like.

On the other surface (the surface on the +Z direction) of the substrate 10, a vibration plate 50 is disposed. The vibration plate 50 may include an elastic film 51 formed on the substrate 10 and an insulating film 52 formed on the elastic film 51. The elastic film 51 is made of, for example, silicon dioxide ($SiO_2$), and the insulating film 52 is made of, for example, zirconium oxide ($ZrO_2$). The elastic film 51 is not necessarily a different member from the substrate 10. The elastic film 51 may be a thin portion cut from the substrate 10.

Piezoelectric elements 300 each including a first electrode 60, a piezoelectric layer 70, and a second electrode 80 are disposed on the insulating film 52. An adhesion layer 56 (not shown in FIGS. 2 to 4, see FIGS. 5 to 11) is disposed between the insulating film 52 and the first electrode 60 for enhancing the adhesion between the insulating film 52 and the first electrode 60. The adhesion layer 56 may be made of, for example, titanium oxide ($TiO_x$), titanium (Ti), or silicon nitride (SiN). The adhesion layer 56 may be omitted.

Furthermore, an orientation control layer 73 (see FIGS. 7 to 11) is disposed between the first electrode 60 and the piezoelectric layer 70 for controlling the orientation of the piezoelectric layer 70. The orientation control layer 73 will be described later.

In the piezoelectric element of the present embodiment, the vibration plate 50 and the first electrode are displaced by a displacement of the piezoelectric layer 70 capable of electromechanical conversion. In other words, the vibration plate 50 and the first electrode 60 effectively act as a vibration plate in the present embodiment. In an embodiment, only the first electrode 60 may act as the vibration plate without using the elastic film 51 or the insulating film 52. If the first electrode 60 is disposed directly on the substrate 10, it is desirable that the first electrode 60 be protected by a protective film or the like to avoid coming into contact with ink.

The first electrode 60 is formed for each pressure generating chamber 12. In other words, the first electrodes are discrete electrodes each provided independently for each pressure generating chamber 12. The piezoelectric layer 70 and the orientation control layer 73 are also provided for each pressure generating chamber 12.

The end on the −Y direction side of each first electrode 60 is exposed at the end on the −Y direction side of the corresponding piezoelectric layer 70. The end on the −Y direction side of the first electrode 60 is connected to a leading electrode 90*a*.

The second electrode 80 extends in the X direction over the vibration plate 50, the first electrodes 60, the orientation control layers 73, and the piezoelectric layers 70. In other words, the second electrode 80 is a common electrode.

The second electrode 80 is connected to a leading electrode 90*b*. The leading electrodes 90*a* and the leading electrode 90*b* may be formed at one time by forming a layer of the material of the leading electrodes 90*a* and 90*b* over the entire surface of the substrate 10 and patterning the layer.

The present embodiment illustrates a liquid ejecting head in which the first electrodes 60 are discrete electrodes provided one each for the pressure generating chambers 12 while the second electrode 80 is a common electrode extending over the arrangement of the pressure generating chambers 12. In another embodiment, however, a first electrode 60 may be a common electrode extending over the arrangement of the pressure generating chambers 12, while second electrodes 80 are discrete electrodes provided one each for the pressure generating chambers 12.

A protective substrate 30 is joined to the substrate 10 having the piezoelectric elements 300 thereon with an adhesive 35. The protective substrate 30 has a manifold section 32 therein. The manifold section 32 defines a part of the manifold 100. In the present embodiment, the manifold section 32 passes through the protective substrate 30 in the thickness direction (Z direction) and extends across the widths of the pressure generating chambers 12 (in the X direction). Thus, the manifold section 32 communicates with the communicating section 15 of the flow channel substrate 10. The manifold 100 is thus defined by these sections and acts as a common ink chamber shared by the pressure generating chambers 12.

The protective substrate 30 is made of, for example, glass, ceramic, metal, or resin, and is preferably made of a material having substantially the same thermal expansion coefficient as the material of the flow channel substrate 10. In the present embodiment, the protective substrate 30 is made of monocrystalline silicon, as with the flow channel substrate 10.

A compliance substrate 40 including a sealing film and a fixing plate 42 is joined to the protective substrate 30. The sealing film 41 may be made of a low-rigidity material, and the fixing plate 42 may be made of a metal or any other hard material. The portion of the fixing plate 42 opposing the manifold 100 is completely removed in the thickness direction (Z direction) to form an opening 43. One side (the +Z direction side) of the manifold 100 is closed only with the flexible sealing film 41.

A drive circuit 120 that functions as a signal processing section is secured on the protective substrate 30. The drive circuit 120 may be a circuit board, a semiconductor integrated circuit (IC), or the like. The drive circuit 120 is electrically connected to each leading electrode 90*a* by a conductive connection wire 121, such as bonding wire, running in a through-hole 33. The drive circuit 120 may be electrically connected to a printer controller 200 (see FIG. 1).

The drive circuit 120 functions to control the actuator device (piezoelectric elements 300).

The ink jet recording head thus configured ejects ink droplets as below. First, the ink jet recording head draws an ink through an ink inlet connected to an external ink feeder (not shown) and delivers the ink to fill the spaces from the manifold 100 to the nozzle apertures 21. Then, a voltage is applied between each of the first electrodes 60 corresponding to the respective pressure generating chambers 12 and the second electrode 80 according to the recording signal from the drive circuit 120, thereby bending or deforming the piezoelectric elements 300. The pressure in each pressure generating chambers 12 is increased to eject ink droplets through the nozzle apertures 21.

The piezoelectric element 300 will now be further described in detail. The piezoelectric element 300 includes the first electrode 60, the second electrode 80, the piezoelectric layer 70 between the first electrode 60 and the second electrode 80, and the orientation control layer between the first electrode 60 and the piezoelectric layer 70. The first electrode 60 has a thickness of about 50 nm. The orientation control layer 73 has a thickness in the range of 50 nm to 200 nm, and the piezoelectric layer 70 has a thickness in the range of 50 nm to 2000 nm. Thus, both of these layers are what is called a thin-film piezoelectric. The second electrode 80 has a thickness of about 50 nm. Each value of thickness mentioned herein is an example and is variable within the scope of the invention.

The first electrode 60 is made of a material that can keep conductive without being oxidized during the formation of the orientation control layer 73 and the piezoelectric layer 70, or does not result in significantly low conductivity even if oxidized. Examples of the material of the first electrode include metals, such as platinum (Pt), iridium (Ir), gold (Au), aluminum (Al), copper (Cu), titanium (Ti), silver (Ag), and stainless steel; oxide conductive materials, such as iridium oxide ($IrO_x$), indium tin oxide (ITO), fluorine-doped tin oxide (FTO) and other tin oxide-based conductive materials, zinc oxide-based conductive materials, strontium ruthenate ($SrRuO_3$), lanthanum nickelate ($LaNiO_3$), and element-doped strontium titanate; and conductive polymers. The first electrode 60 may be defined by a multilayer structure, such as Ir/Pt or $IrO_x$/Pt, including different material layers.

Preferably, the material of the first electrode 60 is at least one selected from the group consisting of Pt, Ir, $IrO_x$, Ir/Pt, and $IrO_x$/Pt from the viewpoint of easy orientation of the orientation control layer 73 and the piezoelectric layer 70. In the present embodiment, the material of the first electrode 60 is preferentially oriented in the (111) plane and exhibits an X-ray diffraction (XRD) spectrum in which the diffraction peak derived from the (111) plane has a half-width of 10° or less. The phrase "preferentially oriented" used herein implies that all the crystals or a large proportion of the crystals are oriented in a specific direction, such as in the (111) plane, the (100) plane, or the (110) plane. The proportion of the oriented crystals may be 60% or more, and is preferably 75% or more, more preferably 80% or more.

It is generally known that use of a Pt electrode is highly likely to cause electrical short-circuiting between the upper and the lower electrode, while use of an Ir electrode reduces the incidence of short-circuiting and use of an $IrO_x$ electrode does not cause short circuiting. The reason why the use of an Pt electrode increases the risk of short-circuiting between the lower and the upper electrode is probably diffusion of Pt atoms into the piezoelectric layer. More specifically, Pt diffuses in the piezoelectric layer having a predetermined thickness, from the lowermost portion to the approximate middle portion in the thickness direction. This is the cause of short-circuiting. On the other hand, Ir is intrinsically unlikely to diffuse, and $IrO_x$, which does not form grain boundaries, is more unlikely to diffuse. Thus, use of Ir or $IrO_x$ reduces the incidence of short-circuiting between the upper and the lower electrode, as described above.

In the present embodiment, the orientation control layer 73 is formed before forming the piezoelectric layer 70 on the first electrodes 60 (this process will be described in detail later). Even if the first electrode contains Pt, the orientation control layer 73 prevents the Pt from diffusing into the piezoelectric layer. Therefore, the first electrode 60 can be formed of at least one selected from the above cited preferred materials: Pt, Ir, $IrO_x$, Ir/Pt, and $IrO_x$/Pt.

The orientation control layer 73 contains crystals of a complex oxide having a perovskite structure (perovskite complex oxide) containing potassium (K), sodium (Na), calcium (Ca), and niobium (Nb) and preferentially oriented in the (100) plane. This perovskite complex oxide is a complex oxide having an A site containing K, Na, and Ca, and a B site containing Nb (hereinafter referred to as KNCN). A perovskite structure is represented by $ABO_3$. The A site of this structure has 12 oxygen ligands, and the B site has 6 oxygen ligands to form an octahedron. In the perovskite complex oxide used in the present embodiment, K, Na, and Ca are present in the A site, and Nb is present in the B site. The orientation control layer 73 made of such KNCN is oriented in the (100) plane independently of the state (crystalline state) of the underlying layer. The orientation control layer 73 functions to preferentially orient the crystals in the piezoelectric layer 70 having the perovskite structure formed thereon in the (100) plane.

Although the A site in the present embodiment contains Ca as a further element, any of the other Group II elements beryllium (Be), magnesium (Mg), strontium (Sr), barium (Ba), and radium (Ra) may be added. The proportion of the Groups II element contained in the crystals of the perovskite complex oxide in the orientation control layer 73 is preferably 0.1 at % to 30 at % relative to the number of K atoms and is also 0.1 at % to 10 at % relative to the total number of K and Na atoms. If the mole ratio of K to Na is 1:1, the mole ratio of the total moles of K, Na, and the Group II element to the total moles of K, Na, the Group II element, and Nb is preferably 0.4 to 0.6. When the proportion of the Group II element in the crystals of the perovskite complex oxide in the orientation control layer 73 is such a range, the orientation control layer 73 functions to preferentially orient the crystals in the piezoelectric layer 70 in the (100) plane.

The piezoelectric layer 70 is made of a piezoelectric material containing a complex oxide having a perovskite structure $ABO_3$. Such a piezoelectric material may be a lead-free perovskite complex oxide. Examples of the lead-free piezoelectric material include bismuth ferrate ($BiFeO_3$, referred to as BFO), barium titanate ($BaTiO_3$, referred to as BT), potassium sodium niobate (($K,Na)NbO_3$, referred to as KNN), potassium sodium lithium niobate (($K,Na,Li)NbO_3$), potassium sodium, lithium niobate tantalate (($K,Na,Li)(Nb,Ta)O_3$), bismuth potassium titanate (($Bi_{1/2}K_{1/2})TiO_3$, referred to as BKT), barium sodium titanate (($Bi_{1/2}Na_{1/2})TiO_3$, referred to as BNT), and bismuth manganate ($BiMnO_3$, referred to as BM). Also, the lead-free piezoelectric material may be a complex oxide (($Bi,K)(Ti,Fe)O_3$) containing bismuth (Bi), potassium, titanium (Ti), and iron (Fe), a complex oxide (($Bi,Ba)(Fe,Ti)O_3$) containing Bi, Fe, barium (Ba), and Ti, or a (($Bi,Ba)(Fe,Ti)O_3$)-based complex oxide further containing a metal, such as manganese (Mn), cobalt (Co), and chromium (Cr), represented by, for example, (($Bi,Ba)(Fe,Ti,M)O_3$) (M represents Mn, Co, or Cr). Among these, BFO and KNN are preferred.

The piezoelectric material is not limited to lead-free materials and may be a lead-containing piezoelectric material, such as lead zirconate titanate (PZT) or a PZT-based material to which a metal oxide, such as niobium oxide, nickel oxide or magnesium oxide, is added. Examples of such a lead-containing piezoelectric material include lead titanate ($PbTiO_3$), lead zirconate titanate ($Pb(Zr,Ti)O_3$), lead zirconate ($PbZrO_3$), lead lanthanum titanate (($Pb,La)TiO_3$), lead lanthanum zirconate titanate (($Pb,La)(Zr,Ti)O_3$), and lead magnesium niobate zirconium titanate (Pb(Zr,Ti)(Mg,Nb)O$_3$). Among these, PZT is preferred.

The piezoelectric layer 70 made of such a piezoelectric material is oriented in the (100) plane so as to follow the orientation of the orientation control layer 73 by being formed on the orientation control layer 73. The piezoelectric layer 70 preferably is in a rhombohedral system, a monoclinic system, or an orthorhombic system from the viewpoint of how much the piezoelectric layer can be displaced. Also, a tensile stress in an in-plane direction occurs in the piezoelectric layer 70. The tensile stress is likely to occur particularly in the piezoelectric layer 70 formed by a liquid phase process.

The (111) plane of Pt, which is represented by Pt(111), has the same atomic arrangement and substantially the same interatomic distance as the (111) plane of KNN having a pyrochlore structure, which is represented by KNN$_{Py}$(111). The misfit of the lattice parameters between KNN and Pt is 0% to 0.7%. If a KNN piezoelectric layer 70 is formed on a Pt first electrode 60, KNN$_{Py}$(111) is grown on Pt(111). The oxygen octahedron of KNN having a pyrochlore structure and the oxygen octahedron of KNN having a perovskite structure have the same shape. A pyrochlore phase is converted into a perovskite phase by being treated at high temperature. Hence, a (100) plane-oriented KNN layer is formed on the Pt(111), but the degree of the orientation of the layer is low. In the present embodiment, the orientation control layer 73 is made of KNCN that has the effect of further reducing the lattice spacing between KNN and Pt, so that the misfit of the lattice parameters between KNN and Pt is reduced. Thus, KNN preferentially oriented in the (100) plane is grown on Pt(111) with KNCN therebetween.

It is known that the lattice spacing in an in-plane direction at the (100) plane of KNCN is smaller than that of KNN because KNCN has the same crystallite size as KNN and exhibits an XRD diffraction peak shifted toward the low angle side. If the first electrode 60 is made of Ir, KNCN is more suitable than KNN for the (111) plane of Ir ((Ir(111)) having a small lattice spacing. Thus, KNN preferentially oriented in the (100) plane can be formed on Ir(111), where many crystals are tilted from the normal of the substrate, with KNCN therebetween. In the present embodiment, KNN preferentially oriented in the (100) plane can be formed on the first electrode 60 with KNCN therebetween even if the first electrode is made of any material. Thus, the degree of the orientation of the KNN crystals is kept high to prevent the piezoelectric performance from being reduced.

In a conventional process in which a KNN piezoelectric layer 70 is formed on a 6-inch or larger wafer used as the substrate 10, the rate of temperature increase decreases or varies due to the size of the substrate because the heat capacity of a larger wafer increases compared with smaller substrates. In addition, when the solvent is evaporated or when carbon, hydrogen, or the like oxidizes into a volatile substance and evaporates, airflow is generated at the surface of the wafer, and the airflow varies the evaporation speed or the atmosphere. Since large-area substrates are affected by a variety of factors as above, it is difficult to form a preferentially (100)-oriented KNN piezoelectric layer 70 on a large-area substrate 10.

In the case of forming a KNCN orientation control layer 73 on the first electrode 60 and forming a KNN piezoelectric layer 70 on the orientation control layer 73, however, the presence of the orientation control layer 73 extends the ranges of acceptable process conditions compared with the case of not forming the orientation control layer 73, and accordingly, the KNN piezoelectric layer can be more preferentially oriented in the (100) plane, and the peak intensity of the KNN (100) plane is increased. Thus, in-plane non-uniformity of the piezoelectric layer 70 is reduced. Consequently, a preferentially (100)-oriented KNN piezoelectric layer 70 can be uniformly formed on the substrate 10.

The second electrode 80 is a common electrode disposed over the surfaces of the piezoelectric layers 70 opposite the first electrodes 60. The second electrode 80 may be made of the same material as the first electrode 60, and the material may be a single substance or a mixture of two or more substances.

A method for manufacturing the piezoelectric element 300, as well as a method for manufacturing an ink jet recording head (recording head 1), will now be described with reference to FIGS. 5 to 11. FIGS. 5 to 11 are sectional views illustrating a process for manufacturing an ink jet recording head.

Figure 5:
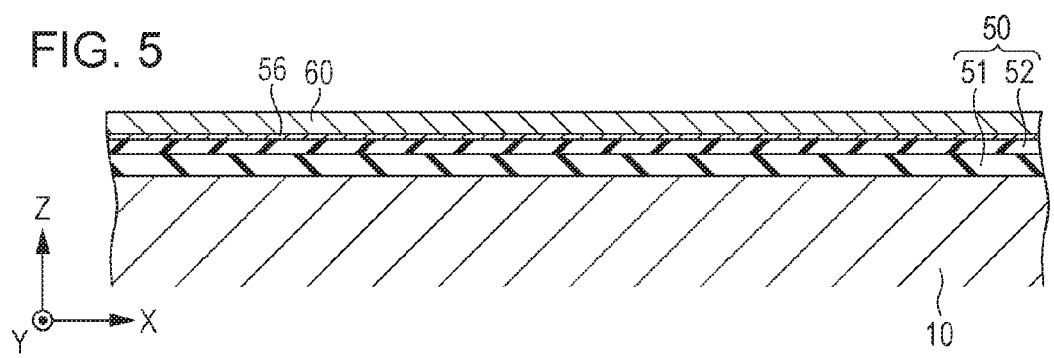
FIG. 5 is a sectional view illustrating a process for manufacturing an ink jet recording head.

Referring to FIG. 5, a silicon substrate is prepared as the flow channel substrate 10. Next, the substrate 10 is subjected to thermal oxidation to form a silicon oxide (SiO$_2$) elastic film 51 on the surface thereof. Then, a zirconium film is formed on the elastic film 51 by sputtering, vapor deposition, or the like, and the zirconium film is subjected to thermal oxidation to form a zirconium oxide (ZrO$_2$) insulating film 52. Thus, a vibration plate 50 including the elastic film 51 and the insulating film 52 is formed on the substrate 10.

Subsequently, a titanium oxide (TiO$_x$) adhesion layer 56 is formed on the insulating film 52.

The adhesion layer 56 can be formed by sputtering, thermal oxidation, or the like. The adhesion layer 56 may be omitted. Subsequently, a film for forming the first electrodes 60 is formed on the adhesion layer 56. The first electrode 60 film is may be formed by a gas phase process, such as sputtering, vacuum vapor deposition (physical vapor deposition (PVD)), or laser ablation, or a liquid phase process, such as spin coating.

Figure 6:
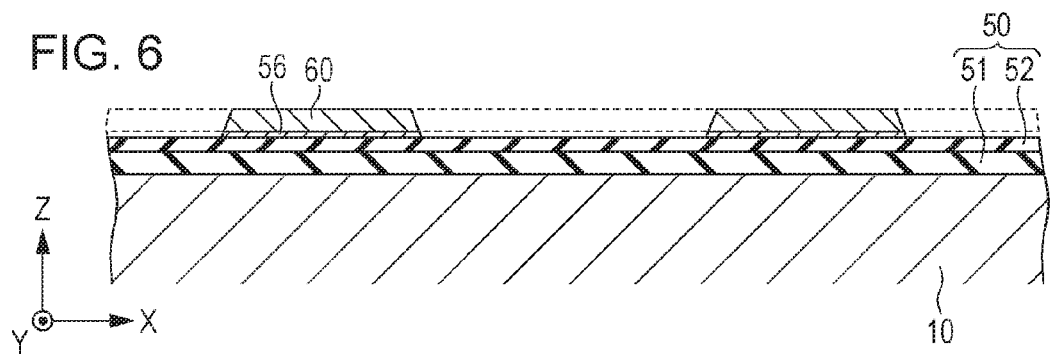
FIG. 6 is a sectional view illustrating the process for manufacturing an ink jet recording head.

Then, the adhesion layer 56 and the first electrode film are simultaneously patterned as shown in FIG. 6. This patterning may be performed by a dry process, such as reactive ion etching (RIE) or ion milling, or a wet process using an etchant. The adhesion layer 56 and the first electrode 60 film may be patterned into any shape without particular limitation.

Figure 7:
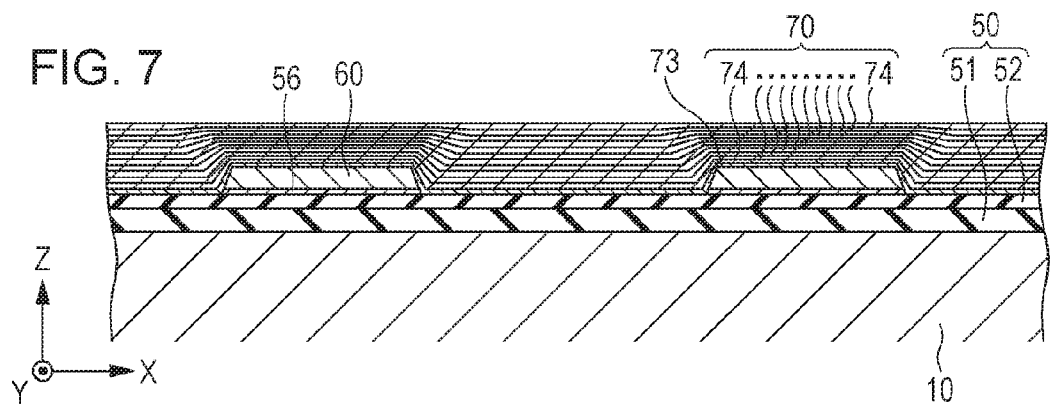
FIG. 7 is a sectional view illustrating the process for manufacturing an ink jet recording head.

Then, the orientation control layer 73 and the piezoelectric layer 70 are formed as shown in FIG. 7. These layers may be formed by any method without particular limitation. For example, each of the layers may be formed by a chemical solution method, such as a sol-gel method or metal-organic deposition (MOD), in which a coating of a solution containing a organometallic compound (precursor solution) is dried at a temperature and fired at a higher temperature.

The orientation control layer 73 and the piezoelectric layer 70 each may be formed by any other method, such as laser ablation, sputtering, pulsed laser deposition (PLD), chemical vapor deposition (CVD), or aerosol deposition. The method for forming these layers can be selected as required from gas phase processes, liquid phase processes, and solid phase processes.

For example, in a wet process (liquid phase process) for forming the orientation control layer 73 and the piezoelectric layer 70, a single-layer orientation control layer 73 and a plurality of piezoelectric films 74 in a multilayer structure are formed through a sequence of steps including applying a precursor solution to form a precursor film (coating step), drying the precursor film (drying step), heating the dried precursor film for degreasing (degreasing step), and firing the decreased precursor film (firing step). Details of this process will be described later. Hence, the piezoelectric layer 70 is formed by repeating a sequence of steps from the coating step to the firing step. Alternatively, a sequence of steps from the coating step to the degreasing step may be repeated, and then the firing step is performed.

The layers or films formed by a wet process each have an interface with the adjacent layer or film. Layers or films formed by a wet process have traces of liquid application or film formation. Such traces are visible interfaces that can be seen by observing the cross section thereof or analyzing the concentration distribution of elements in the layers or the films. Although the term interface refers to strictly a boundary between layers or films, an interface used herein refers to a boundary and its vicinity. When a cross section of layers or films formed by a wet process is observed, such an interface is seen as a deeper color or paler portion than the other portion around a boundary between adjacent layers or films. Also, when the films or layers are analyzed for concentration distribution of elements, such an interface is seen as a denser or sparser portion than the other portion around a boundary between adjacent layers or films. The piezoelectric layer 70 is formed by repeating a sequence of steps from the coating step to the firing step, or repeating a sequence of steps from the coating step to the degreasing and then performing the firing step (thus defined by a plurality of piezoelectric films 74 lying one on top of another), hence having a plurality of interfaces between the piezoelectric films 74. Also, the orientation control layer 73 has an interface.

The wet process for forming the orientation control layer 73 and the piezoelectric layer 70 is performed according to the following procedure. First, precursor solutions (a MOD solution or a sol) each containing a organometallic compound are prepared for the orientation control layer 73 and the piezoelectric layer 70 (preparation step). Then, the precursor solution for the orientation control layer 73 is applied onto the patterned first electrodes 60 by spin coating or the like to form a precursor film (coating step). Next, the precursor film is heated to a predetermined temperature of, for example, about 130° C. to 250° C. for a certain period for drying (drying step), and the dried precursor film is further heated to a predetermined temperature of, for example, about 300° C. to 450° C. and kept at this temperature for a certain period for degreasing (degreasing step). Furthermore, the degreased precursor film is heated to a higher temperature of, for example, about 650° C. to 800° C. and kept at this temperature for a certain period for crystallization, thus forming an orientation control layer 73 (firing step). Subsequently, the piezoelectric layer 70 defined by a plurality of piezoelectric films 74 as shown in FIG. 7 is formed in the same manner as the orientation control layer 73 by repeating a sequence of steps including the coating step, the drying step, the degreasing step, and the firing step.

Each of the precursor solutions is prepared by dissolving or dispersing in an organic solution organometallic compounds that can form the above-described perovskite complex oxide by firing. Hence, the precursor solution for the orientation control layer 73 contains K, Na, Ca, and Nb as the central metals of the respective organometallic compounds. The precursor solution for the piezoelectric layer 70 contains predetermined elements. The precursor solution for the piezoelectric layer 70 may further contain a organometallic compound containing an element other than the predetermined elements. Examples of the element contained in the organometallic compound include Mn, Li, Ba, Ca, Sr, Zr, Ti, Ta, Sb, Fe, Co, Ag, Mg, Zn, Cu, La, Sm, Ce, and Al.

The organometallic compound may be an alkoxide, an organic acid salt, or a β-diketone complex. For each precursor solution, organometallic compounds are mixed so that the metal elements in the perovskite complex oxide will have a desired mole ratio.

The organometallic compound containing K may be potassium 2-ethylhexanoate or potassium acetate. The organometallic compound containing Na may be sodium 2-ethylhexanoate or sodium acetate. The organometallic compound containing Ca may be diethoxy calcium, diisopropoxy calcium, diisobutoxy calcium, or di-n-butoxy calcium. The organometallic compound containing Nb may be niobium 2-ethylhexanoate, or pentaethoxy niobium. One of the other organometallic compounds may contain Pb, and examples thereof include lead acetate. Examples of the organometallic compound containing Zr include zirconium monoacetylacetonate, and zirconium bisacetylacetonate.

Examples of the organometallic compound containing Ti include titanium alkoxides, such as titanium isopropoxide, titanium 2-ethylhexanoate, and titanium acetate. Examples of the organometallic compound containing Bi include bismuth 2-ethylhexanoate and bismuth acetate. Examples of the organometallic compound containing Fe include iron 2-ethylhexanoate, iron acetate, and iron tris(acetylacetonate). The organometallic compound containing Mn may be manganese 2-ethylhexanoate. Two or more organometallic compounds may be used in combination. For example, potassium 2-ethylhexanoate and potassium acetate may be used in combination as the organometallic compound containing K.

Examples of the solvent in each precursor solution include propanol, butanol, pentanol, hexanol, octanol, ethylene glycol, propylene glycol, octane, decane, cyclohexane, xylene, toluene, tetrahydrofuran, acetic acid, octylic acid, and 2-n-butoxyethanol. A mixture of two or more of these solvents may be used.

The precursor solutions may contain an additive, such as 2-ethylhexanoic acid, for stabilizing the dispersion of the organometallic compounds.

The heating apparatus used for the drying, degreasing and firing steps may be a rapid thermal annealing (RTA) apparatus using an infrared lamp for heating, or a hot plate.

Figure 8:
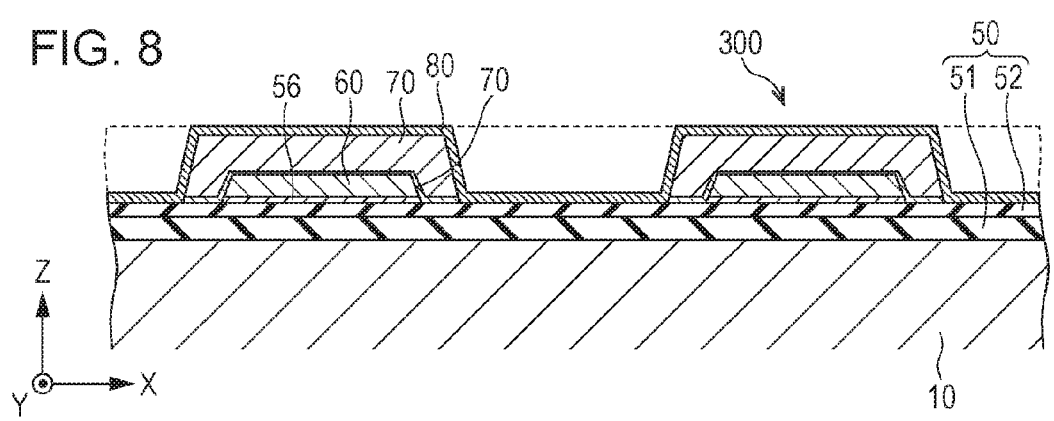
FIG. 8 is a sectional view illustrating the process for manufacturing an ink jet recording head.

Subsequently, the orientation control layer 73 and the piezoelectric layer 70 defined by a plurality of piezoelectric films 74 are patterned as shown in FIG. 8. This patterning may be performed by a dry process, such as reactive ion etching or ion milling, or a wet process using an etchant. The orientation control layer 73 and the piezoelectric layer 70 may be patterned into any shape without particular limitation. Then, the second electrode is formed over the patterned orientation control layers 73 and piezoelectric layers 70. The second electrode 80 may be formed in the same manner as the first electrode 60.

Before and after forming the second electrode 80 over the orientation control layers 73 and the piezoelectric layers 70, reheating treatment (post-annealing) may be performed at a temperature of about 600° C. to 800° C., if necessary. This post-annealing allows satisfactory interfaces to be formed between the orientation control layer 73 and the first electrode 60, between the orientation control layer 73 and the piezoelectric layer 70, between the piezoelectric layer 70 and the second electrode 80, and improves the crystallinity of the orientation control layer 73 and the piezoelectric layer 70.

The piezoelectric elements 300, each including the first electrode 60, the orientation control layer 73, the piezoelectric layer 70, and the second electrode 80 are thus produced through the above-described steps. In other words, portions in which the first electrode 60, the orientation control layer 73, the piezoelectric layer 70, and the second electrode 80 lie one on top of another act as the piezoelectric elements 300.

Figure 9:
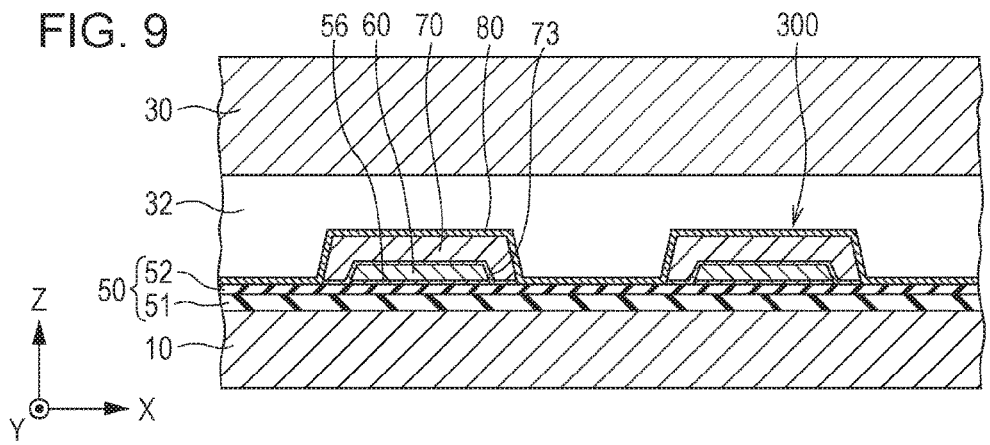
FIG. 9 is a sectional view illustrating the process for manufacturing an ink jet recording head.

Subsequently, a protective substrate 30 (protective substrate wafer) is joined to the side of the flow channel substrate 10 on which the piezoelectric elements 300 are arranged, as shown in FIG. 9, with an adhesive 35 (see FIG. 4) therebetween. Then, the protective substrate 30 was shaved to reduce the thickness. A manifold section 32 and a through-hole 33 are formed in the protective substrate 30 (see FIGS. 2 to 4).

Figure 10:
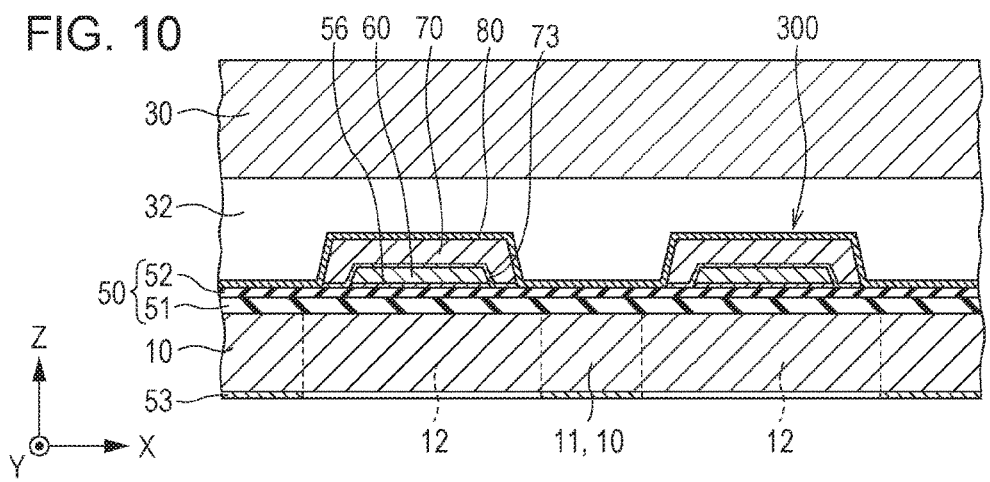
FIG. 10 is a sectional view illustrating the process for manufacturing an ink jet recording head.
Figure 11:
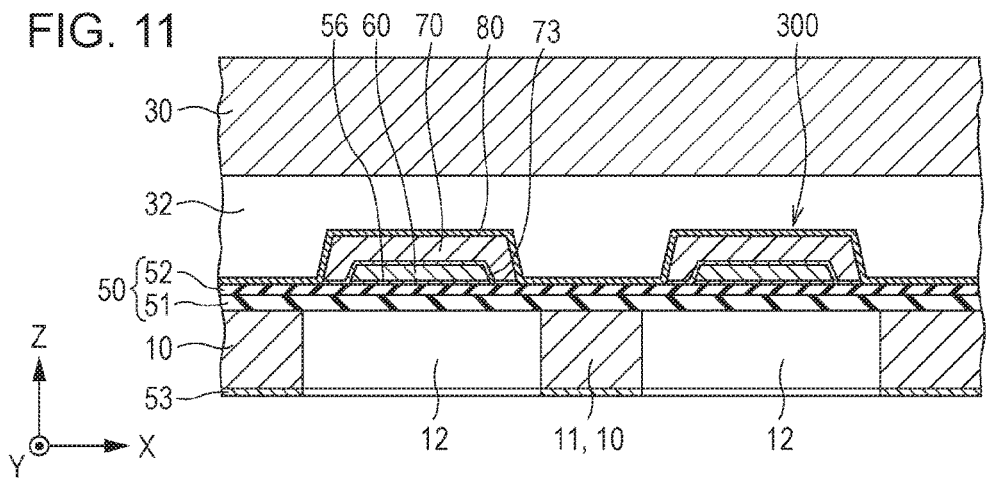
FIG. 11 is a sectional view illustrating the process for manufacturing an ink jet recording head.

Subsequently, a mask layer 53 is formed on the surface of the flow channel substrate 10 opposite the piezoelectric elements 300, and is then patterned into a predetermined shape, as shown in FIG. 10. Then, the flow channel substrate 10 is subjected to anisotropic etching (wet etching) with an alkaline solution, such as a KOH solution, by using the mask layer 53 to form pressure generating chambers 12 defined by a plurality of partitions 11 in the substrate 10, as shown in FIG. 11. In addition to the pressure generating chambers 12 corresponding to the respective piezoelectric elements 300, ink supply channels 13, the communication paths 14, and the communicating section 15 (see FIGS. 2 to 4) are formed.

Subsequently, unnecessary outer portions of the flow channel substrate 10 and the protective substrate 30 are cut off, as shown in FIGS. 2 and 4, by dicing or the like. Furthermore, a nozzle plate 20 is joined to the side of the flow channel substrate 10 opposite the protective substrate 300. Also, a compliance substrate 40 is joined to the protective substrate 30. Thus, a block of chips of recording heads 1 is completed through the steps described up to here. The block is divided into separate chips to yield recording heads 1.

EXAMPLES

The present invention will be further described in detail with reference to Examples below. However, the invention is not limited to the following Examples.

Preparation of Sample 1

A 1200 nm-thick silicon oxide ($SiO_2$) film (elastic film 51) was formed at the surface of a 6-inch (100) monocrystalline silicon (Si) substrate (flow channel substrate 10) by thermal oxidation of the Si substrate. Then, a zirconium film was formed on the $SiO_2$ film by sputtering, and the zirconium film was thermally oxidized into a 400 nm-thick zirconium oxide ($ZnO_2$) film (insulating film 52). Subsequently, a 40 nm-thick titanium (Ti) film was formed on the $ZnO_2$ film by RF magnetron sputtering and was then thermally oxidized into a titanium oxide ($TiO_x$) film (adhesion layer 56). Subsequently, a 100 nm-thick (111) plane-oriented platinum (Pt) film (first electrode 60) was formed on the $TiO_x$ film by RF magnetron sputtering.

Then, KNN precursor solution (K/Na=1/1) with a metal element concentration of 0.6 mol/L was prepared by mixing of a solution of potassium acetate in 2-n-butoxyethernol, a solution of sodium acetate in n-octane, and a solution of pentaethoxy niobium in 2-n-ethylhexanoic acid (preparing step). Subsequently, the KNN precursor solution was applied onto the Pt film-coated Si substrate by spin coating at a rotational speed of 1500 rpm to 3000 rpm (coating step). Then, the coating of the KNN precursor solution on the Si substrate was dried on a hot plate at 180° C. for 5 minutes (drying step).

Furthermore, the Si substrate was subjected to degreasing on a hot plate at 350° C. for 10 minutes (degreasing step). Subsequently, the Si substrate was fired at 600° C. for 3 minutes with an RTA apparatus (firing step). Thus, a 70 nm-thick KNN film (piezoelectric film 74) was formed.

Subsequently, the KNN precursor solution was applied onto the KNN film on the Si substrate by spin coating at a rotational speed of 1500 rpm to 3000 rpm (coating step). Then, the coating of the KNN precursor solution on the Si substrate was dried on a hot plate at 180° C. for 5 minutes (drying step).

Furthermore, the Si substrate was subjected to degreasing on a hot plate at 350° C. for 10 minutes (degreasing step). Subsequently, the Si substrate was fired at 750° C. for 5 minutes with an RTA apparatus (firing step). Thus, another 70 nm-thick KNN film (piezoelectric film 74) was formed to yield a perovskite complex oxide layer (piezoelectric layer 70). Thus, sample 1 was completed. The proportions of metal elements in the resulting KNN film were hardly varied from those in the KNN precursor solution.

Preparation of Samples 2 to 6

KNCN precursor solutions were prepared by mixing a mixture of a solution of potassium acetate in 2-n-butoxyethanol, a solution of sodium acetate in n-octane, and a solution of pentaethoxy niobium in 2-n-ethylhexanoic acid with a solution of diisobutoxy calcium in 2-n-ethylhexanoic acid so that the proportion of calcium (Ca) in each solution would be 1 at %, 2 at %, 3 at %, 4 at %, or 5 at % relative to the total of potassium (K) and sodium (Na). Then, the KNCN precursor solutions were applied onto the respective Pt film-coated Si substrates in the same manner as in the case of Sample 1. Each of the coatings was subjected to the drying step and the firing step in the same manner as in the case of Sample 1 to yield a 70 nm-thick KNCN film (orientation control layer 73). The proportions of metal elements in the resulting KNCN film were hardly varied from those in the KNCN precursor solution.

Then, a KNN precursor solution prepared in the same manner as in the case of Sample 1 was applied onto each of the Pt film-coated Si substrates in the same manner as in the case of Sample 1. The coating was subjected to the drying step and the firing step in the same manner as in the case of Sample 1 to yield a 70 nm-thick KNN film (piezoelectric film 74) that is a perovskite complex oxide layer (piezoelectric layer 70). Thus, Samples 2 to 6 were completed. The proportions of metal elements in the resulting KNN film were hardly varied from those in the KNN precursor solution.

Orientation of Samples 1 to 6

Figure 12:
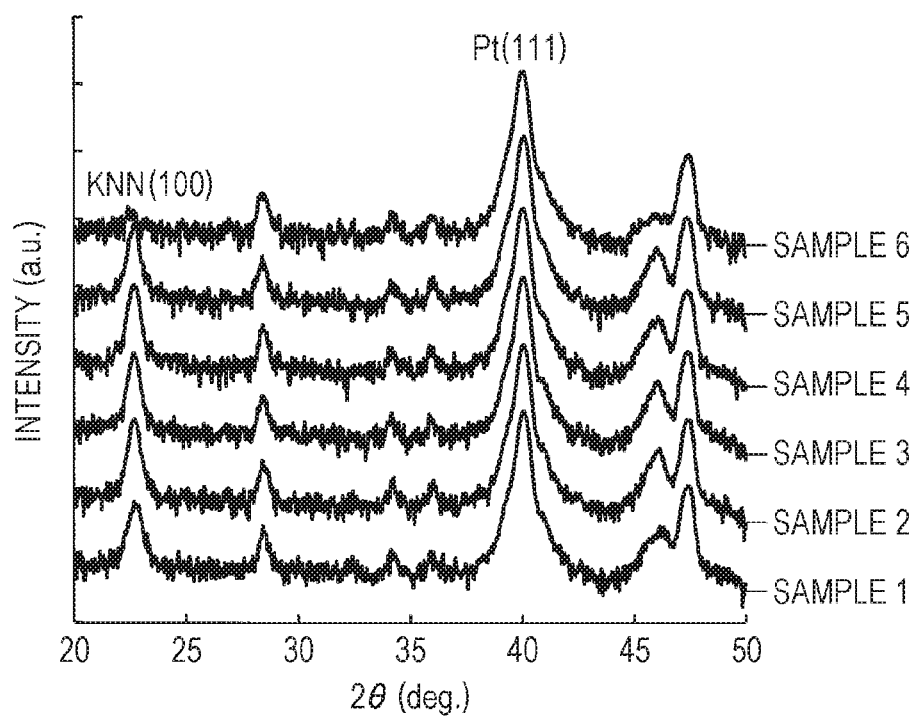
FIG. 12 is a representation of XRD patterns of Samples 1 to 6.
Figure 13:
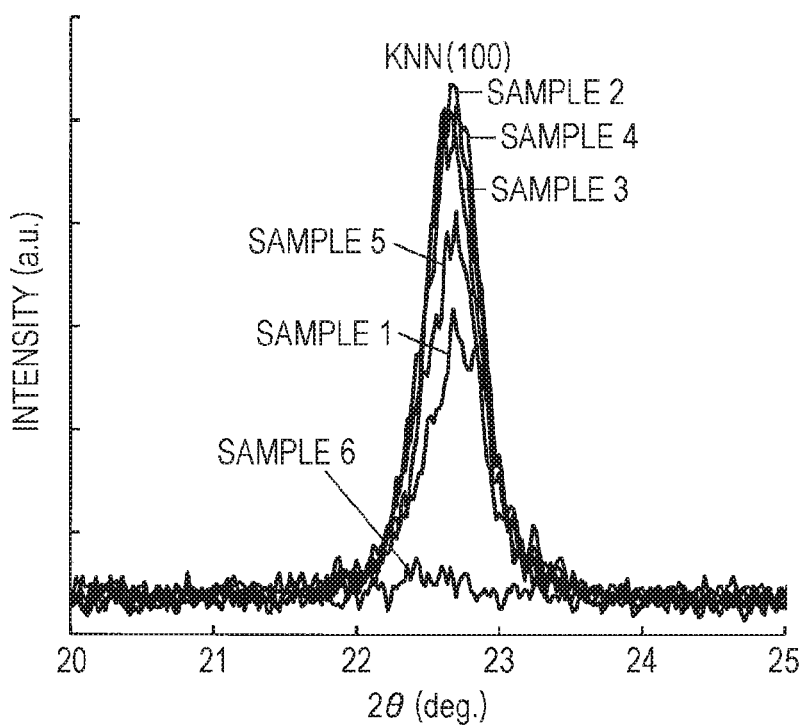
FIG. 13 is a representation illustrating the portion in a specific 2θ range of the XRD patterns shown in FIG. 12.

X-ray diffraction (XRD) patterns of Samples 1 to 6 were obtained by XRD. FIG. 12 shows XRD patterns of Samples 1 to 6, and FIG. 13 shows the portions in a specific 2θ range of the XRD patterns shown in FIG. 12. As shown in FIG. 12, the KNN films of the Samples were oriented in the (100) plane, except for Sample 6. FIG. 13 shows that Samples 2 to 5 to which Ca was added in a proportion of 1 at % to 4 at % exhibited a higher peak intensity than the Sample with a Ca concentration of 0 at % (Sample 1), and that the KNN film of the Sample with a Ca concentration of 5 at % (Sample 6) was not oriented in the (100) plane.

Preparation of Samples 7 to 10

Samples 7 to 10 were prepared in the same manner and conditions as Sample 4, except that the KNCN precursor solutions were prepared so that the proportion of the total moles of K, Na, and Ca to the total moles of K, Na, Ca, and Nb ((K+Na+Ca)/(K+Na+Ca+Nb)) would be 0.51, 0.52, 0.54, or 0.55 with the K:Na ratio kept at 1:1 (Na/K=1/1). Note that the KNCN precursor solution of Sample 4 was prepared with a (K+Na+Ca)/(K+Na+Ca+Nb) proportion of 0.50. The proportions of metal elements in the resulting KNCN film were hardly varied from those in the KNCN precursor solution.

Orientation of Samples 4 and 7 to 10

Figure 14:
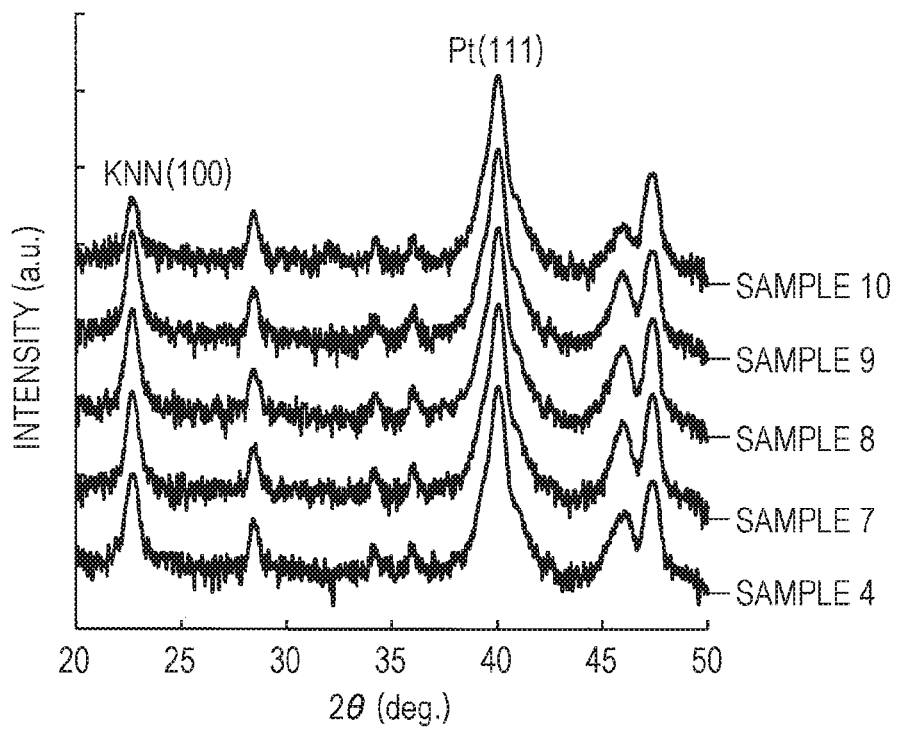
FIG. 14 is a representation of XRD patters of Samples 4 and 7 to 10.
Figure 15:
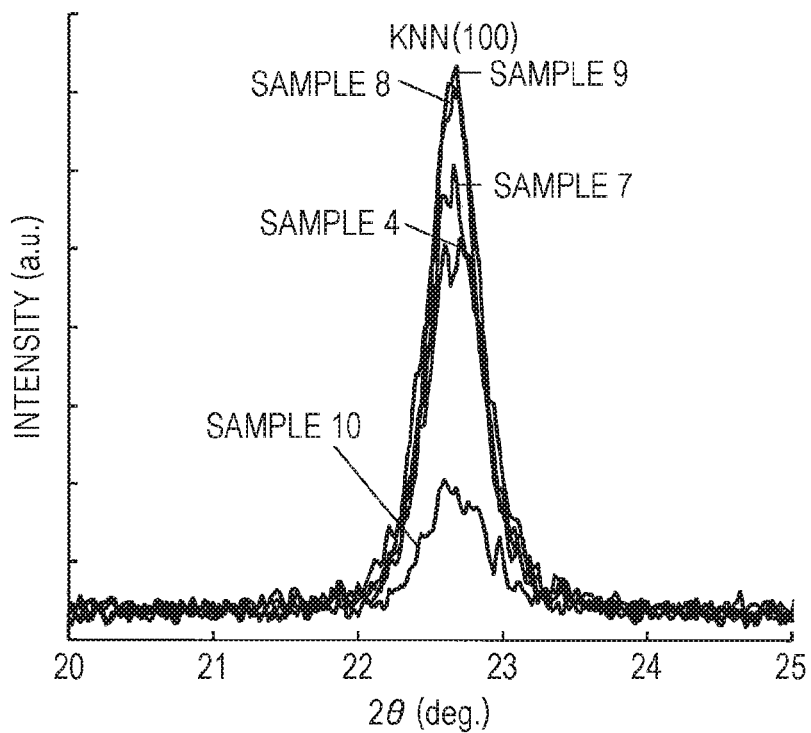
FIG. 15 is a representation illustrating the portion in a specific 2θ range of the XRD patterns shown in FIG. 14.

XRD patterns of Samples 4 and 7 to 10 were obtained in the same manner as in the case of Samples 1 to 6. FIG. 14 shows XRD patterns of Samples 4 and 7 to 10, and FIG. 15 shows the portions in a specific 2θ range of the XRD patterns shown in FIG. 14. As shown in FIG. 14, all the KNN films of these Samples were oriented in the (100) plane. FIG. 15 shows that Samples 7 to 9 in which (K+Na+Ca)/(K+Na+Ca+Nb) was 0.51 to 0.54 exhibited a higher peak intensity than Sample 4 in which (K+Na+Ca)/(K+Na+Ca+Nb) was 0.50, suggesting that the KNN films of Samples 7 to 10 were preferentially oriented in the (100) plane.

In-Plane Uniformity of Samples 1 and 8

XRD patterns of Sample 1 (Ca=0 at %, (K+Na+Ca)/(K+Na+Ca+Nb)=0.5 (mol/L)) and Sample 8 (Ca=3 at %, (K+Na+Ca)/(K+Na+Ca+Nb))=0.52 (mol/L)) were examined at the center of the Si substrate (wafer) and at another 4 points at regular intervals on a circumference at 2 cm from the edge of the wafer, and the (100) plane peak intensity of the KNN film (Sample 1) and the KNCN film (Sample 8) was measured for evaluating the in-plane uniformity. The results are shown in the following Table. As shown in the Table, the average of peak intensities was increased with a reduced dispersion by forming a KNCN film on a KNN film as the orientation control layer 73.

TABLE

|  | Sample 1 (KNN film) | Sample 8 (KNCN film) |
| --- | --- | --- |
| Center | 26.466 | 157.813 |
| Measurement point 1 | 139.281 | 174.480 |
| Measurement point 2 | 164.582 | 150.782 |
| Measurement point 3 | 87.205 | 166.308 |
| Measurement point 4 | 136.729 | 153.831 |
| Standard deviation | 54.875 | 9.685 |
| Average | 110.853 | 160.643 |

Preparation of Sample 11

A 100 nm-thick (111) plane-oriented Pt film was formed on a $TiO_x$ film by RF magnetron sputtering, and a 50 nm-thick Ir film (first electrode 60) was formed on the Pt film by sputtering. A KNCN precursor solution was prepared so that the proportion of Ca to K would be 10 at %. A perovskite complex oxide layer (piezoelectric layer 70) was formed by repeating a sequence of steps for forming a 70 nm-thick KNN film (piezoelectric film 74) from the coating step to the firing step 7 times. The other operation was performed in the same manner as in the case of Sample 2, and thus Sample 11 was prepared. The proportions of metal elements in the resulting KNCN film and KNN film were hardly varied from those in the KNCN and KNN precursor solutions.

Orientation of Sample 11

Figure 16:
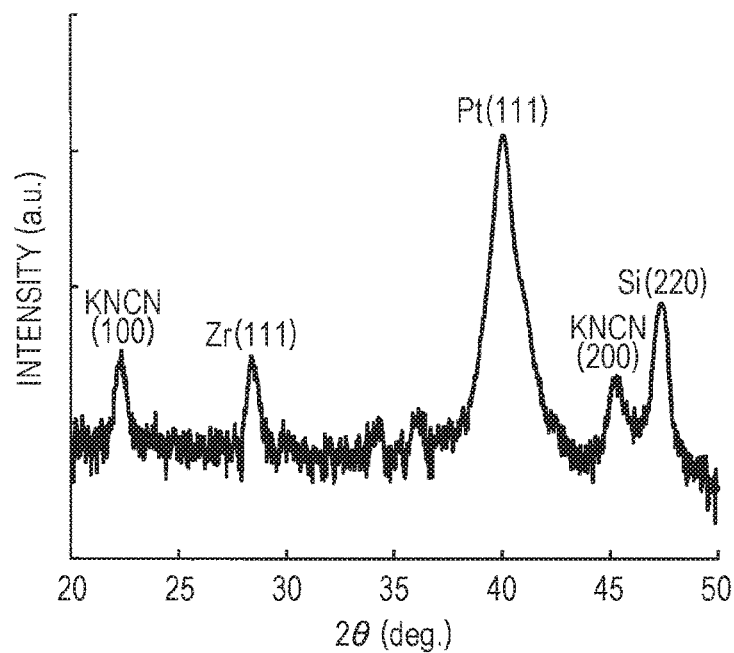
FIG. 16 is an XRD pattern of a KNCN film.
Figure 17:
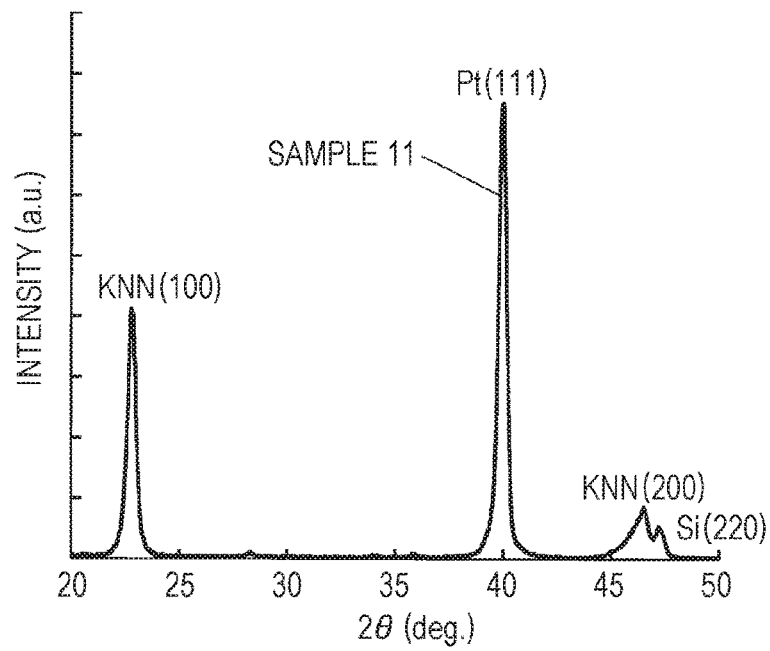
FIG. 17 is an XRD pattern of Sample 11.

The XRD pattern of Sample 11 was obtained in the same manner as in the case of Samples 1 to 6. FIG. 16 shows the XRD pattern of the KNCN film, and FIG. 17 shows the XRD pattern of Sample 11. As shown in FIG. 16, the KNCN film was oriented in the (100) plane. Also, the KNN film on the (100) plane-oriented KNCN film was preferentially oriented in the (100) plane, as shown in FIG. 17.

Preparation of Sample 12

Sample 12 was prepared in the same manner as Sample 2, except that the piezoelectric film 74 was replaced with a nm-thick BFO film formed with a BFO precursor solution that is a mixture of a solution of bismuth 2-ethylhexanoate in 2-ethylhexane and a solution of iron 2-ethylhexanoate in 2-ethylhexanoic acid having a bismuth-to-iron mole ratio of 1:1 (Bi/Fe=1/1), and that no KNCN film (orientation control layer 73) was formed. The proportions of metal elements in the resulting BFO film were hardly varied from those in the BFO precursor solution.

Preparation of Sample 13

Sample 13 was prepared in the same manner as Sample 2, except that a 70 nm-thick KNCN film was formed as the orientation control layer 73 by using a KNCN precursor solution prepared by mixing a mixture of a solution of potassium acetate in 2-n-butoxyethanol, a solution of sodium acetate in n-octane, and a solution of pentaethoxy niobium in 2-n-ethylhexanoic acid with a solution of diisobutoxy calcium in 2-n-ethylhexanoic acid with a K:Na:Ca:Nb mole ratio of 41.5:61.5:3:100, and that no KNN film (piezoelectric film 74) was formed on the KNCN film. The proportions of metal elements in the resulting KNCN film were hardly varied from those in the KNCN precursor solution.

Preparation of Sample 14

Sample 14 was prepared in the same manner as Sample 13, except that the same BFO film (piezoelectric film 74) as in Sample 12 was formed on the same KNCN film (orientation control layer 73) as in Sample 13. The proportions of metal elements in the resulting KNCN film and BFO film were hardly varied from those in the KNCN and BFO precursor solutions.

Orientation of Samples 12 to 14

Figure 18:
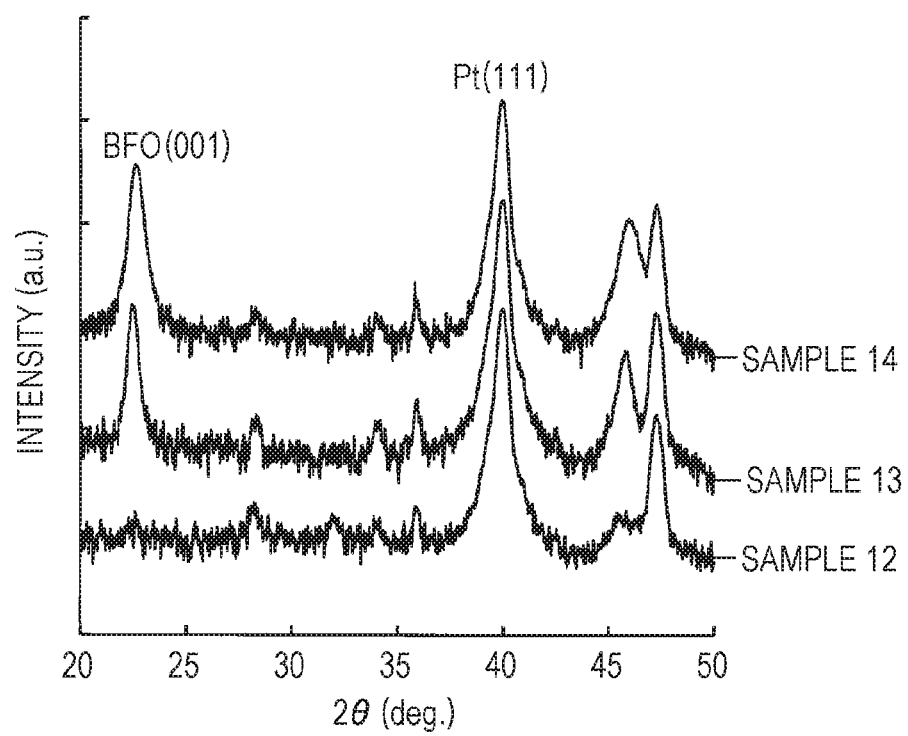
FIG. 18 is a representation of XRD patterns of Samples 12 to 14.
Figure 19:
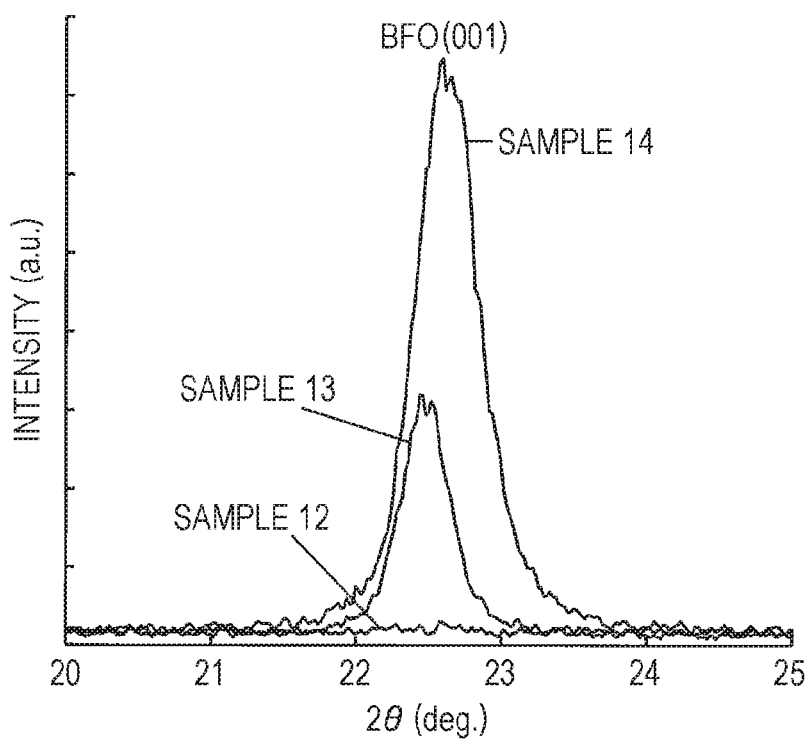
FIG. 19 is a representation illustrating the portion in a specific 2θ range of the XRD patterns shown in FIG. 18.

XRD patterns of Samples 12 to 14 were obtained in the same manner as in the case of Samples 1 to 6. FIG. 18 shows XRD patterns of Samples 12 to 14, and FIG. 19 shows the portions in a specific 2θ range of the XRD patterns shown in FIG. 18.

As shown in these figures, Sample 12 did not exhibit a diffraction peak around 2θ of 22° (2θ=22°). This suggests that the BFO film on the Pt film did not oriented in the (001) plane. Sample 13 exhibited a diffraction peak around 2θ of 22°, but not diffraction peaks derived from the (110) plane and the (111) plane. This suggests that the KNCN film intended for the orientation control layer 73 had a perovskite structure and was oriented in the (001) plane. Sample 14 exhibited a strong peak around 2θ of 22°, but not diffraction peaks derived from the (110) plane and the (111) plane as in the case of Sample 13. This suggests that the BFO film on the KNCN film had a perovskite structure and was preferentially oriented in the (001) plane.

Preparation of Sample 15

A PZT precursor solution was prepared by adding acetic acid as the main solvent, water, and, polyethylene glycol (thickener) to a mixture of lead (II) acetate trihydrate, zirconium tetra-n-propoxide, and titanium isopropoxide so that the solution can form a PZT film (piezoelectric film 74) of 100 nm to 200 nm in thickness) having the composition represented by the following formula (1), and PZT films were formed so that the resulting piezoelectric layer (piezoelectric layer 70) would have a total thickness of 500 nm to 2000 nm, by repeating a sequence of steps from the coating step to the degreasing step, and a 50 nm-thick Ir film (second electrode 20) was formed on the perovskite complex oxide layer. The other operation was performed in the same manner as in Sample 2, and Sample 15 was thus prepared. The proportions of metal elements in the resulting KNCN film and PZT film were hardly varied from those in the KNCN and PZT precursor solutions.

$$Pb_x(Zr_yTi_{(1-y)})O_3 \quad (1)$$

(x and y satisfy 1.0≤x≤1.2 and 0.4≤y≤0.6.)
Orientation of Sample 15

Figure 20:
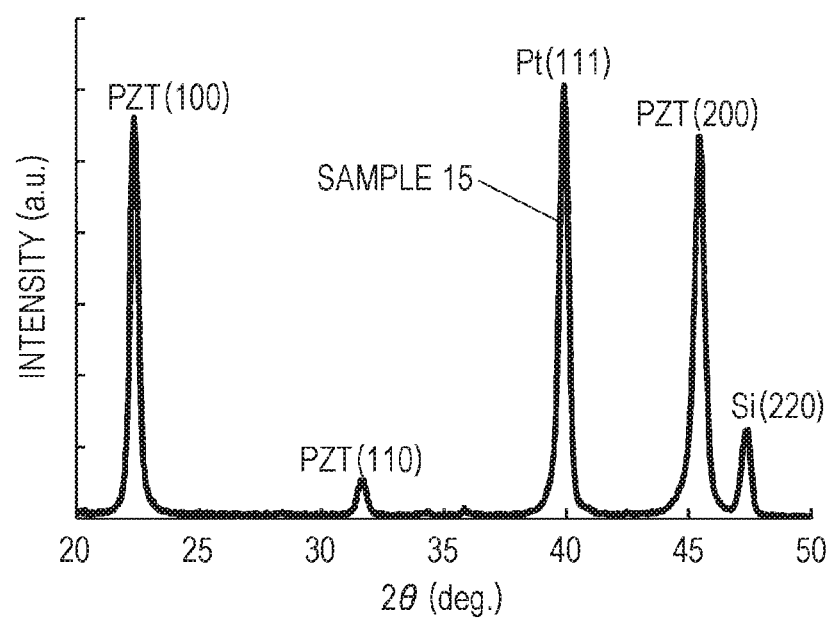
FIG. 20 is an XRD pattern of Sample 15.

The XRD pattern of Sample 15 was obtained in the same manner as in the case of Samples 1 to 6. FIG. 20 shows the XRD pattern of Sample 15. This figure suggests that the PZT film was preferentially oriented in the (100) plane.

Other Embodiments

Although the above-described first embodiment has described a liquid ejecting head amounted to a liquid ejection apparatus as the piezoelectric element-applied device of the invention, the invention is not limited to the disclosed embodiment. Also, although the disclosed liquid ejecting head is an ink jet recording head, the invention may be embodied in other liquid ejecting heads that eject liquid other than ink.

Examples of the liquid ejecting head that eject liquid other than ink include color material ejection heads used for manufacturing color filters of liquid crystal displays or the like, electrode material ejection heads used for forming electrodes of organic EL displays, FED (field emission displays), or the like, and bioorganic material ejection heads used for manufacturing bio-chips.

The piezoelectric element according to an embodiment of the invention and the device including the same are suitable for use in piezoelectric actuators because of high piezoelectric performance thereof. Examples of such a piezoelectric actuator include ultrasonic motors, vibratory dust removing devices, piezoelectric transformers, piezoelectric speakers, piezoelectric pumps, temperature-electric converters, and pressure-electric converters.

The piezoelectric element according to an embodiment of the invention and the device including the same are also suitable for use in piezoelectric sensor elements because of high piezoelectric performance thereof. Examples of such a sensor element include ultrasonic detectors (ultrasonic sensors), angular velocity sensors, acceleration sensors (gyro sensors), vibration sensors, tilt sensors, pressure sensors, collision sensors, human sensors, infrared sensors, terahertz sensors, heat sensors (thermal sensors), pyroelectric sensors, and piezoelectric sensors. The piezoelectric element according to an embodiment of the invention and the device including the same may be applied to filters, such as a cutoff filter for infrared radiation or any other harmful radiation, an optical filter using the photonic crystal effect of quantum dot formation, and an optical filter using optical interference of a thin film.

An ultrasonic measuring device provided with an ultrasonic sensor therein may include, for example, the piezoelectric element according to an embodiment of the invention and a controller that measures the object to be detected by using signals of ultrasonic waves generated from and/or received by the piezoelectric element. The ultrasonic measuring device provides information of the object, such as position, shape, velocity, and so forth, based on the period from the point at which ultrasonic waves are generated to the point at which an echo signal of ultrasonic waves reflected from the object is received. A piezoelectric element can be used as the element for generating ultrasonic waves, or the element for detecting the eco signal. The piezoelectric element of an embodiment of the invention used as the element for generating ultrasonic waves or the element for detecting eco signals exhibits satisfactory displacement in the ultrasonic measuring device.

The piezoelectric element according to an embodiment of the invention and the device including the same are also suitable for use as ferroelectric element because of high ferroelectric performance thereof. Examples of such a ferroelectric element include ferroelectric memory devices (FeRAM), ferroelectric transistors (FeFET), ferroelectric arithmetic circuits (FeLogic), and ferroelectric capacitors.

The piezoelectric element according to an embodiment of the invention and the device including the same allow the domains thereof to be controlled by voltage and is accordingly suitable for use as voltage-controlled optical element. Examples of such an optical element include wavelength converters, optical waveguides, optical path modulators, refractive index control elements, and electronic shutter mechanisms.

The piezoelectric element according to an embodiment of the invention and the device including the same are also suitable for use as pyroelectric element because of high pyroelectric performance thereof.

What is claimed is:

1. A piezoelectric element comprising:
   a first electrode and a second electrode;
   a piezoelectric layer between the first electrode and the second electrode; and
   an orientation control layer between the first electrode and the piezoelectric layer, the orientation control layer containing a perovskite complex oxide that contains potassium, sodium, calcium, and niobium and is preferentially oriented in the (100) plane.

2. The piezoelectric element according to claim 1, wherein the proportion of the calcium to the potassium in the orientation control layer is 0.1 at % to 30 at %.

3. The piezoelectric element according to claim 1, wherein the proportion of the calcium to the total of the potassium and the sodium in the orientation control layer is 0.1 at % to 10 at %.

4. The piezoelectric element according to claim 1, wherein in the orientation control layer, the mole ratio of the potassium to the sodium is 1:1, and the ratio of the total moles of the potassium, the sodium, and the calcium to the total moles of the potassium, the sodium, the calcium, and the niobium is 0.4:1 to 0.6:1.

5. The piezoelectric element according to claim 1, wherein the first electrode contains at least one selected from the group consisting of platinum, iridium, and iridium oxide.

6. A device comprising the piezoelectric element as set forth in claim 1.

7. A device comprising the piezoelectric element as set forth in claim 2.

8. A device comprising the piezoelectric element as set forth in claim 3.

9. A device comprising the piezoelectric element as set forth in claim 4.

10. A device comprising the piezoelectric element as set forth in claim 5.

11. The piezoelectric element according to claim 1, wherein the perovskite complex oxide includes another element selected from the group consisting of beryllium, magnesium, strontium, barium, and radium.

* * * * *